(12) United States Patent  (10) Patent No.: US 6,982,379 B2
Saka et al.  (45) Date of Patent: Jan. 3, 2006

(54) AUTOMOTIVE ELECTRICAL CONNECTION BOX AND A METHOD OF MOUNTING IT

(75) Inventors: Yukinori Saka, Yokkaichi (JP); Tooru Nakagawa, Yokkaichi (JP); Yoshito Oka, Yokkaichi (JP)

(73) Assignee: Sumitomo Wiring Systems, Ltd., (JP)

( * ) Notice: Subject to any disclaimer, the term of this patent is extended or adjusted under 35 U.S.C. 154(b) by 0 days.

(21) Appl. No.: 11/056,734

(22) Filed: Feb. 11, 2005

(65) Prior Publication Data

US 2005/0178576 A1  Aug. 18, 2005

(30) Foreign Application Priority Data

Feb. 13, 2004  (JP) .............................. 2004-036433

(51) Int. Cl.
H01J 5/00 (2006.01)
(52) U.S. Cl. ...................... 174/50; 174/17 R; 174/135; 174/58; 220/374
(58) Field of Classification Search ................. 174/58, 174/53, 135, 60, 17 R, 50, 52.1; 220/3.3, 220/3.7, 3.8, 4.02, 374, DIG. 6; 439/535; 248/906
See application file for complete search history.

(56) References Cited

U.S. PATENT DOCUMENTS 5,159,155 A   10/1992  Nishihara
6,384,334 B1 * 5/2002  Webb ........................... 174/58
6,486,399 B1 * 11/2002  Armstrong et al. ........... 174/58
6,784,365 B2 * 8/2004  Ohashi et al. ................. 174/50
6,794,573 B1 * 9/2004  Ofcharsky et al. ........... 174/58
6,903,272 B2 * 6/2005  Dinh ........................... 174/58

FOREIGN PATENT DOCUMENTS

JP    63-97328    6/1988
JP    63-167328   10/1988
JP    2002-58128  2/2002

* cited by examiner

Primary Examiner—Dhiru R. Patel
(74) Attorney, Agent, or Firm—Gerald E. Hespos; Anthony J. Casella

(57) ABSTRACT

An electrical connection box has upper and lower casings (10, 11) for accommodating circuitry. A surrounding wall (10a) of the upper casing (10) fits inside a surrounding wall (11a) of the lower casing (11). Engaging locking claws (10b, 11b) project from the outer surface of the surrounding wall (10a) of the upper casing (10) and from the inner surface of the surrounding wall (11a) of the lower casing (11). An upper wall of the upper casing (10) is inclined down from a center portion to three peripheral edges. A drainage path (13) is defined by a clearance between the surrounding walls (10a, 11a) of the upper and lower casings (10, 11). A bottom wall of the lower casing (11) has drainage holes (14) at the bottom end of the drainage path (13).

10 Claims, 6 Drawing Sheets ained and has many parts, thereby increasing production costs. It is also difficult to prevent water from entering along the outer circumferential surface of a wiring harness connected with the electrical connection box.

AUTOMOTIVE ELECTRICAL CONNECTION BOX AND A METHOD OF MOUNTING IT

BACKGROUND OF THE INVENTION

1. Field of the Invention

The invention relates to an automotive electrical connection box designed to drain water from a lower part of the electrical connection box.

2. Description of the Related Art

An engine compartment of an automotive vehicle is exposed to highly pressurized water during a car wash. Heavy rain and splashes from road surfaces also can direct water into an engine compartment. Thus, it is very difficult to prevent water from entering an electrical connection box in an engine compartment. A completely watertight electrical connection box is complicated and has many parts, thereby increasing production costs. It is also difficult to prevent water from entering along the outer circumferential surface of a wiring harness connected with the electrical connection box.

U.S. Pat. No. 5,159,155 and FIG. 5 herein show an electrical connection box with drainage openings in a bottom wall. With reference to FIG. 5, the electrical connection box has a lower casing 1, and drainage openings 1a are formed in the bottom wall of the lower casing 1. A lower cover 2 is mounted below the lower casing 1 and has a bottom wall that inclines down toward the center. A drainage opening 2a is formed at a bottommost position of the bottom wall. Water that enters the electrical connection box first falls from the drainage openings 1a of the lower casing 1 to the lower cover 2 and is collected. The collected water then drains to the outside through the drainage opening 2a of the lower cover 2.

The drainage openings 1a of the lower casing 1 are at the center of the casing in the electrical connection box of FIG. 5. Thus, water falls down through a part of the electrical connection box that has the internal circuitry, and there is a danger of exposing the internal circuitry to water.

Japanese Unexamined Utility Model Publication No. S63-97328 and FIG. 6 herein disclose another electrical connection box. With reference to FIG. 6, the electrical connection box has a lower casing 3, an upper casing 4 and an internal circuit element 5 therebetween. The lower casing 4 has an upper wall 4a that inclines down from the center towards the opposite lateral edges. An inner surrounding wall 3a stands up from the bottom wall of the lower casing and fits inside a surrounding 4b of the upper casing 4. An outer surrounding wall 3b also stands up from the bottom wall of the lower casing 3 and fits outside the surrounding wall 4b of the upper casing 4. Drainage openings 3c are formed in the bottom wall of the lower casing 3 between the inner and outer surrounding walls 3a and 3b. Thus, water on the upper wall 4a of the upper casing 4 runs down along the slanted surfaces, falls down from the peripheral edge, and drains through the drainage openings 3c at the peripheral edges of the bottom wall of the lower casing 3.

Water runs down from the upper wall of the upper casing 4 to the surrounding wall in the electrical connection box of FIG. 6, and does not pass through the internal circuit element 5. However, the double surrounding wall of the lower casing 3 makes the electrical connection box too large.

The invention was developed in view of the above problems, and an object thereof is to drain water securely and without causing the water to pass an internal circuitry area without enlarging an electrical connection box.

SUMMARY OF THE INVENTION

The invention relates to an automotive electrical connection box with upper and lower casings for accommodating internal circuitry. The upper and lower casings each have a surrounding wall, and the surrounding wall of the upper casing fits inside the surrounding wall of the lower casing. The upper casing has an upper wall that inclines down from an intermediate portion to at least one side, and preferably to at least three peripheral sides. A drainage path is defined in a clearance between the surrounding walls of the upper and lower casings. At least one drainage hole is formed in a bottom wall of the lower casing at or near the bottom end of the drainage path. The bottom wall of the lower casing located at or near the bottom end surface of the drainage path is inclined down towards the drainage holes. At least one rib projects from the bottom wall of the lower casing at a location spaced from the surrounding wall of the lower casing to define the drainage path.

Locking claws preferably project from the outer surface of the surrounding wall of the upper casing and the inner surface of the surrounding wall of the lower casing to couple the upper and lower casings together.

The clearance that forms the drainage path preferably is formed by the engagement of the locking claws of the upper and lower casings.

The drainage holes preferably are formed by removing molds for the locking claws of the lower casing.

As described above, the upper wall of the upper casing inclines down from the center to the periphery. Thus, water that enters the electrical connection box is collected at the periphery and does not pass to the internal circuitry at the middle. Accordingly, water will not attach to the internal circuitry.

The surrounding wall of the upper casing fits inside the surrounding wall of the lower casing and the drainage path is formed by the clearance created by interlocking portions between the surrounding walls. Thus, the lower casing does not need a double wall and the electrical connection box can be smaller.

The drainage holes preferably are formed by removing the molds that form the locking claws of the lower casing. Thus, it is not necessary to form separate drainage holes during the molding.

The bottom wall of the lower casing forms part of the bottom end surface of the drainage path and inclines down towards the drainage holes. Thus, water that has run down along the drainage path can be drained efficiently through the drainage holes and to the outside.

The rib for defining the drainage path projects along the peripheral edge of the bottom wall of the lower casing. Thus, water that has run down along the drainage path will not run along the bottom wall of the lower casing and towards the internal circuitry.

A downward inclined portion extends from a center portion of the upper wall of the upper casing towards the surrounding wall at three sides. However, no downward inclined portion is provided at the remaining side where the entrance of water from below is likely to occur. Thus, the upper wall of the upper casing has an inclined portion inclined toward the three sides.

No drainage hole is formed in the bottom wall of the lower casing at the side that has no downward inclined portion.

The electrical connection box may be mounted in a position where one side is particularly exposed to water. The side that is most exposed to water may have no interlocking portion for the surrounding walls of the lower and upper casings. Thus, the bottom wall of the lower casing does not require a mold removal opening to form the locking claw on the side that is exposed to water, and water is less likely to enter The upper wall of the upper casing is not inclined down at the side that has no mold removal opening in the bottom wall of the lower casing, and the drainage path is not defined below this side of the upper wall of the upper casing.

Water that has entered the electrical connection box runs down along the drainage path defined between the surrounding walls of the upper and lower casings due to the presence of the interlocking portions. The water then is drained to the outside through the drainage holes formed in the bottom wall of the lower casing by removing the molds for the locking claws. Therefore, the water having entered the electrical connection box can be drained without enlarging the electrical connection box and without causing the water to pass the area of the internal circuitry.

These and other objects, features and advantages of the present invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

Figure 1:
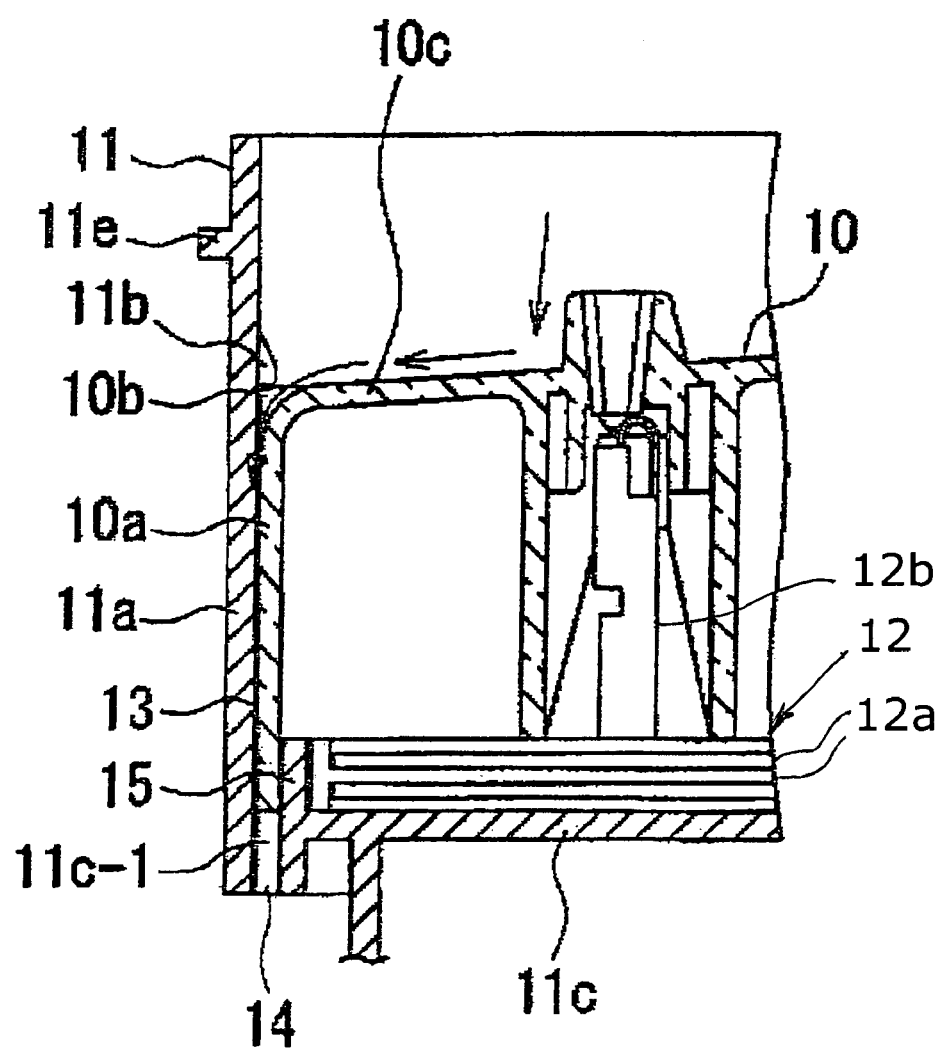
FIG. 1 is a vertical section showing an essential portion of one embodiment of the invention.

An electrical connection box according to the invention includes substantially rectangular upper and lower casings 10 and 11, as shown in FIG. 1. Electrical circuits 12 are provided between the upper and lower casings 10 and 11. The circuits 12 typically will include circuit boards 12a and terminals 12b mounted thereon. The upper casing 10 has a surrounding wall 10a that fits inside a surrounding wall 11a of a lower casing 11. Locking claws 10b project from three outer surfaces of the surrounding wall 10a of the upper casing 10 and engage with locking claws 11b that project from three inner surfaces of the surrounding wall 11a of the lower casing 11 to couple the upper and lower casings 10 and 11 together. No interlocking portion is provided between the upper and lower casings 10 and 11 on the remaining side. However, the upper and lower casings 10 and 11 are held strongly together by the three sides that are coupled.

As shown in FIG. 1, a drainage path 13 is defined by a tiny clearance between the surrounding wall 10a of the upper casing 10 and the surrounding wall 11a of the lower casing 11 where the interlocking portions are provided on the three sides.

Figure 2:
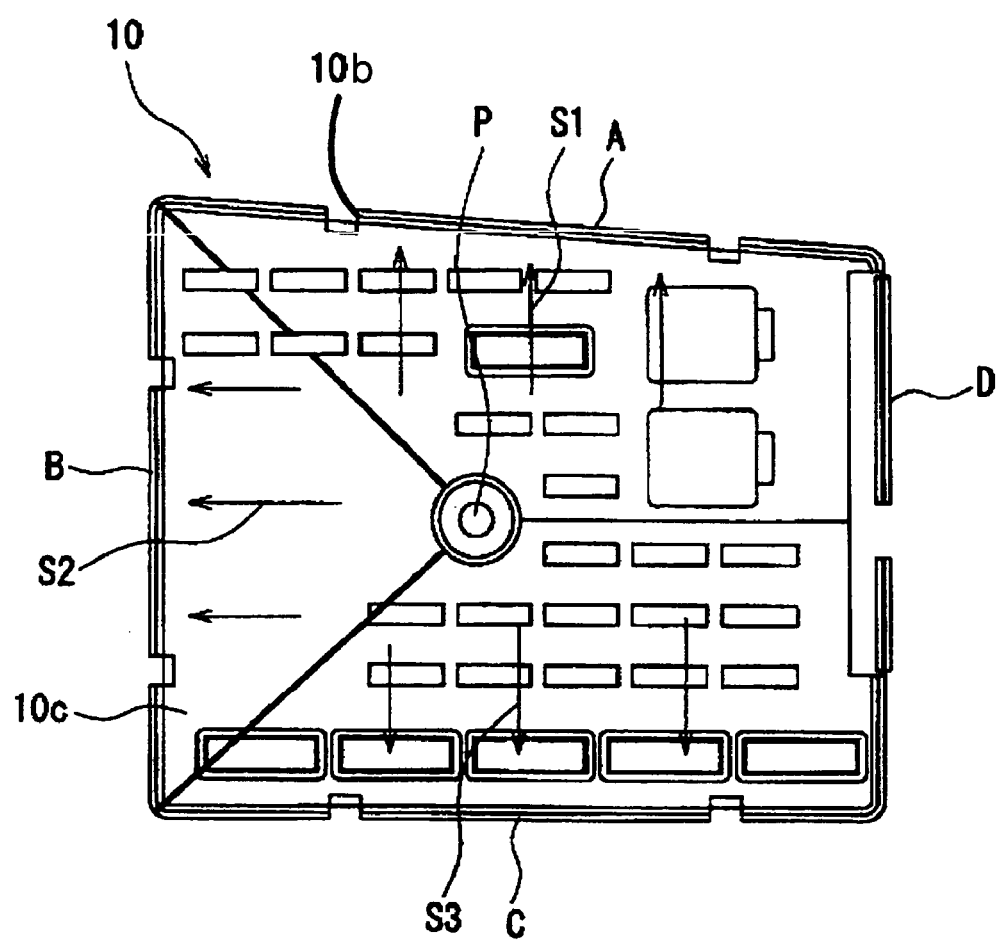
FIG. 2 is a plan view of an upper casing of the embodiment.
Figure 3:
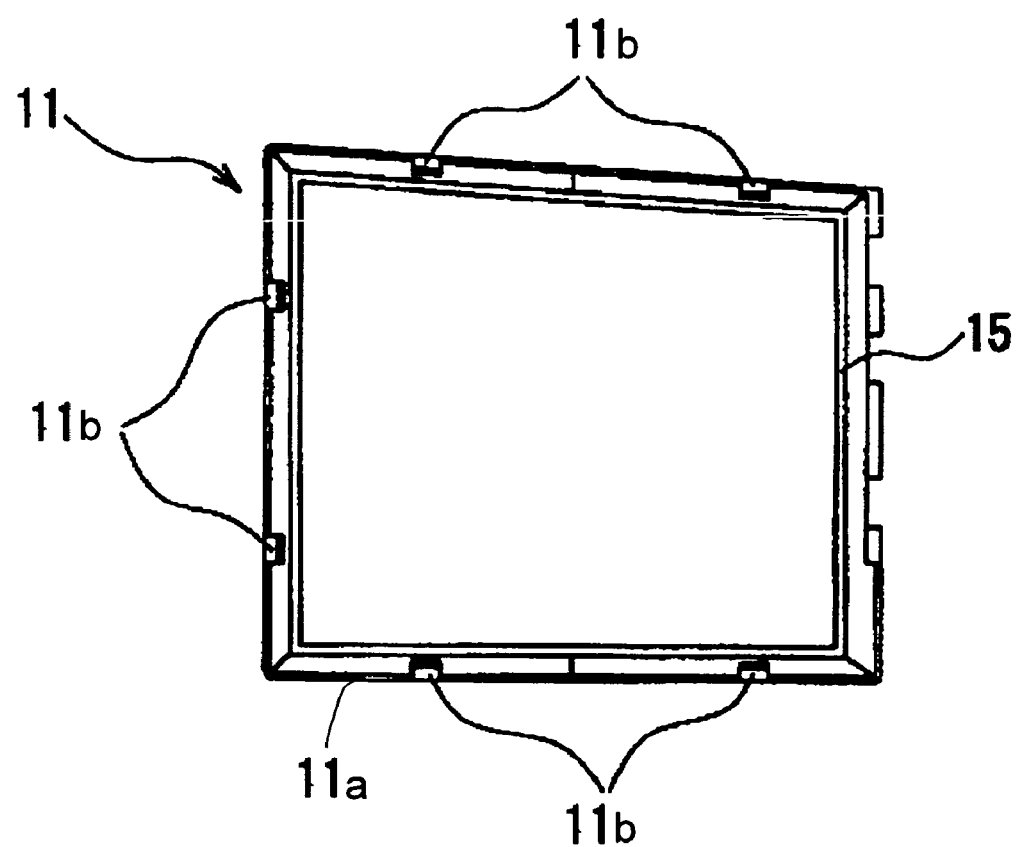
FIG. 3 is a schematic plan view of a lower casing of the embodiment.
Figure 4:
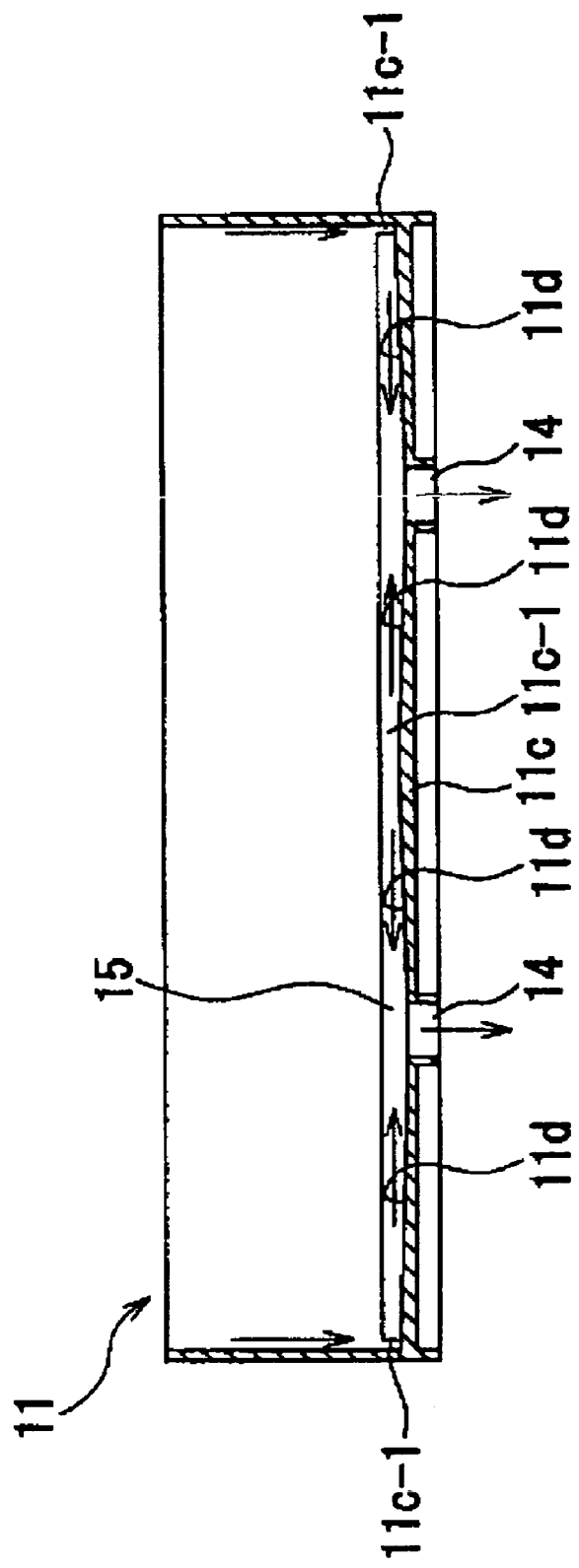
FIG. 4 is an enlarged schematic vertical section of the lower casing.
Figure 5:
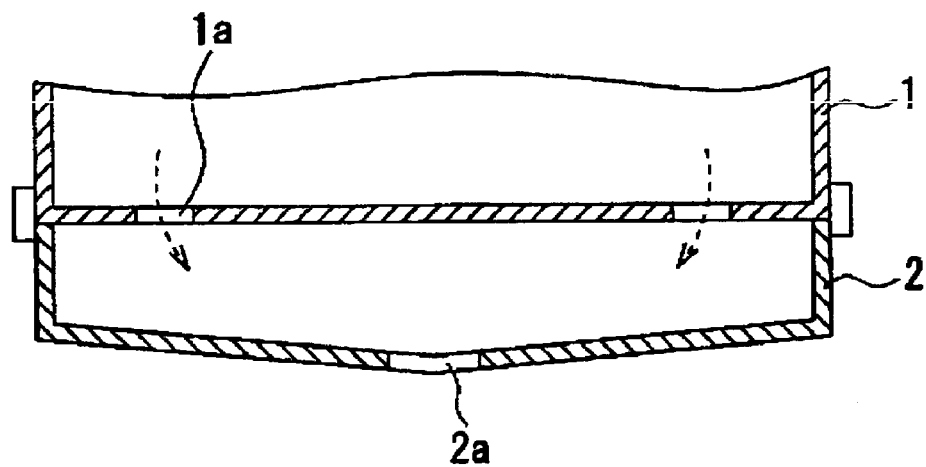
FIG. 5 is a partial section of a prior art electrical connection box.
Figure 6:
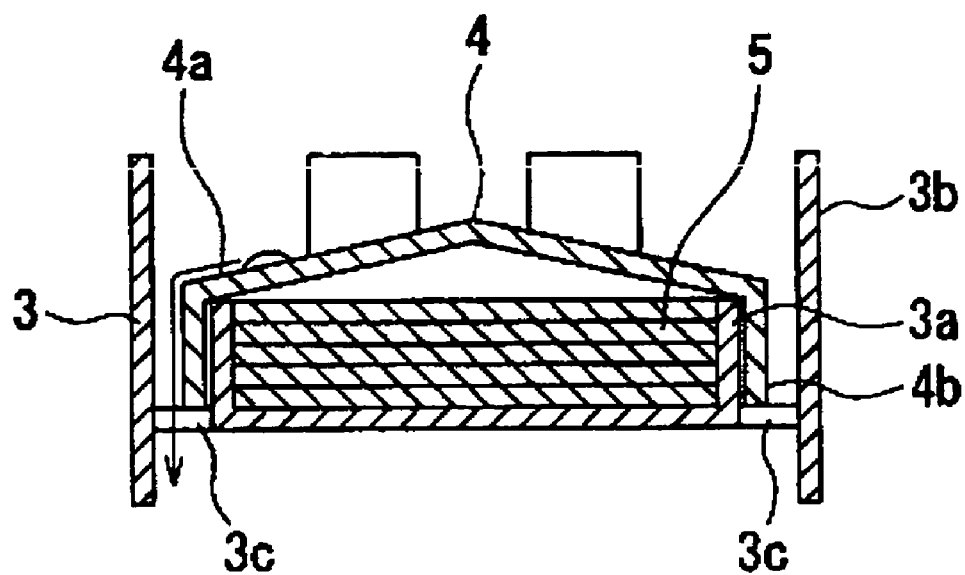
FIG. 6 is a section of another prior art electrical connection box.

As shown in FIG. 2, a substantially rectangular upper wall 10c of the upper casing 10 has slanted surfaces S1, S2, S3 that incline downwardly from a center portion P to three peripheral edges A, B, C. A line connecting the center portion P and the remaining side D is substantially horizontal.

The downward inclinations are set at about 2° to 7°, and preferably at about 3° to 5°. The peripheral edges A, B, C of the downwardly inclined surfaces are substantially continuous with the drainage path 13, and moisture or waterdrops deposited on the upper wall 10c of the upper casing 10 run down along the downwardly inclined surfaces and fall into the drainage path 13.

The lower casing 11 has a bottom wall 11c, and a peripheral portion 11c-1 of the bottom wall 11c defines the bottom end of the drainage path 13. Drainage holes 14 are provided right below the locking claws 11b in the peripheral portion 11c-1. The drainage holes 14 are created by removing molds for forming the locking claws during the molding of the lower casing 11. Thus, there is no need to form extra drainage holes 14 in the lower casing 11.

Two locking claws 11b are provided at each of the three sides in this embodiment, and thus two drainage holes 14 also are provided at each of the three sides. Accordingly, a total of six drainage holes 14 are provided.

A rib 15 projects up from the bottom wall 11c of the lower casing 11 to separate the drainage path 13 from the remainder of the bottom surface. Downward inclinations 11d are provided in the peripheral portion 11c-1 and near the drainage holes 14 to collect and channel water towards the drainage holes 14. The downward inclinations 11d slope at an angle of about 2° to 7°, and preferably at about 3° to 5°.

The surrounding wall 11a of the lower casing 11 projects further up from the upper wall 10c of the upper casing 10, and locks 11e are provided on the outer surface of a projecting part of the surrounding wall 11a to mount an upper cover (not shown) to prevent the entry of water from above.

The electrical connection box constructed is to be installed in an engine compartment of an automotive vehicle so that the side D with no drainage path 13 and no drainage hole 14 is at a position where water is likely to enter from below.

Water may enter the area of the engine compartment from above during a high-pressure car wash or during a heavy rain. Water also may enter the engine compartment in response to splashes from the road surfaces. Thus, water may enter the electrical connection box through the drainage holes 14 in the bottom wall 11c of the lower casing 11, and runs along the drainage path 13 to deposit on the upper wall 10c of the upper casing 10.

The drainage holes 14 are formed by removing the mold for forming the locking claws 11b, as described above. Thus, the bottom wall 11c of the lower casing 11 must be bored.

The upper wall 10c is inclined down. Thus, water deposited on the upper wall 10c of the upper casing 10 runs along the slanted surfaces S1, S2, S3 and towards the peripheral edges A, B, C of the upper wall 10c. The water then flows down into the drainage path 13. The drainage holes 14 are at the peripheral portions 11c-1 of the bottom wall 11c of the lower casing 11 and at the bottom end of the drainage path 13. The peripheral portion 11c-1 has inclinations 11d that slope down towards the draining holes 14. Thus, water that has run down along the drainage path 13 and to the peripheral portions 11c-1 continues down along the inclinations 11d and is drained to the outside through the drainage holes 14.

One side of the above-described electrical connection box has no drainage path and no drainage holes. However, the drainage path and the draining holes may be provided at all four sides of the electrical connection box.

The electrical connection box need not be rectangular. For example, the electrical connection box can be polygonal, round, elliptic or the like, and the drainage holes may be provided along one or more walls thereof.

What is claimed is:

1. An automotive electrical connection box, comprising:
   an upper casing having an upper wall with an intermediate portion and a plurality of peripheral sides, at least one sloped surface on the upper wall sloping down from the intermediate portion to at least one of the peripheral sides, an upper surrounding wall extending down from the upper wall at the peripheral sides;
   a lower casing having a bottom wall and a lower surrounding wall extending up from the bottom wall, a rib extending up from the bottom wall inwardly from the lower surrounding wall, drainage holes being formed through the bottom wall between the lower surrounding wall and the rib, portions of the bottom wall between the lower surrounding wall and the rib being sloped down to the drainage holes; and
   the upper casing being fit on the lower casing so that the upper surrounding wall fits between the lower surrounding wall and the rib and defines a drainage path between the upper and lower surrounding walls for channeling water towards the drainage holes, whereby water is kept away from areas of the bottom wall inward of the rib.

2. The electrical connection box of claim 1, wherein the upper and lower casings are coupled to each other by engaging pairs of locking claws projecting from an outer surface of the upper surrounding wall and an inner surface of the lower surrounding wall.

3. The electrical connection box of claim 2, wherein the locking claws are aligned with the drainage path.

4. The automotive electrical connection box of claim 3, wherein each drainage hole is aligned with a locking claw of the lower casing.

5. The electrical connection box of claim 4, wherein the upper wall of the upper casing has four peripheral sides and three sloped surfaces extending down to three of the peripheral sides, the bottom wall of the lower casing having none of said drainage holes aligned with the fourth peripheral side.

6. The electrical connection box of claim 5, wherein at least one of said drainage holes is provided below the peripheral sides of the sloped surfaces.

7. The automotive electrical connection box of claim 6, wherein the lower casing is polygonal and has a plurality of sides, at least one of said drainage holes being provided on each of the sides of said polygonal lower casing.

8. The electrical connection box of claim 1, further comprising electrical circuits between the upper and lower casings and inward of the rib.

9. The electrical connection box of claim 1, wherein portions of the bottom wall between the lower surrounding wall and the rib are sloped down to the drainage holes an angle in a range of 2 degrees to 7 degrees.

10. The electrical connection box of claim 9, wherein portions of the bottom wall between the lower surrounding wall and the rib are sloped down to the drainage holes an angle in a range of 3 degrees to 5 degrees.

* * * * *